United States Patent
Kong et al.

(10) Patent No.: US 7,151,814 B1
(45) Date of Patent: Dec. 19, 2006

(54) HOGGE PHASE DETECTOR WITH ADJUSTABLE PHASE OUTPUT

(75) Inventors: Shyang Kye Kong, San Diego, CA (US); Kenneth Smetana, San Diego, CA (US); Bruce Harrison Coy, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 846 days.

(21) Appl. No.: 10/290,127

(22) Filed: Nov. 7, 2002

(51) Int. Cl.
*H03D 3/24* (2006.01)

(52) U.S. Cl. ............... 375/376; 324/76.53; 327/147; 327/156; 370/516; 375/327; 375/371; 455/180.3; 455/260

(58) Field of Classification Search ........... 327/108, 327/513; 330/289; 331/46; 359/333; 367/137; 375/354
See application file for complete search history.

(56) References Cited

U.S. PATENT DOCUMENTS

| | | | | |
|---|---|---|---|---|
| 4,779,243 A | * | 10/1988 | West | 367/137 |
| 5,060,301 A | * | 10/1991 | Nishimura | 359/333 |
| 5,391,933 A | * | 2/1995 | Rein | 327/108 |
| 6,052,032 A | * | 4/2000 | Jarvinen | 330/289 |
| 6,297,685 B1 | * | 10/2001 | Ewen et al. | 327/513 |
| 6,421,404 B1 | * | 7/2002 | Nakamura | 375/354 |

* cited by examiner

*Primary Examiner*—Jay K. Patel
*Assistant Examiner*—Adolf DSouza
(74) *Attorney, Agent, or Firm*—Law Office of Gerald of Maliczewski; Gerald Maliczewski

(57) ABSTRACT

A system and method are provided for adjusting the phase output of a Hogge phase detector. The method comprises: using a Hogge phase detector, generating a reference signal; using the Hogge phase detector, generating a phase and reference signals; accepting an adjust signal; modifying the amplitude of the phase signal in response to the adjust signal; integrating the amplitude modified phase signal; using the integrated signal as a phase adjusted signal; integrating the reference signal; using the integrated reference signal and phase adjusted signal to generate a voltage controlled oscillator (VCO) signal; at the Hogge phase detector, accepting the VCO signal as the clock signal. Some aspects of the method further comprise: using the VCO signal to sample data at a settled first phase of the clock; changing the adjust signal; and, using the VCO signal to sample data at a settled second phase of the clock.

13 Claims, 6 Drawing Sheets

Fig. 1 *(PRIOR ART)*
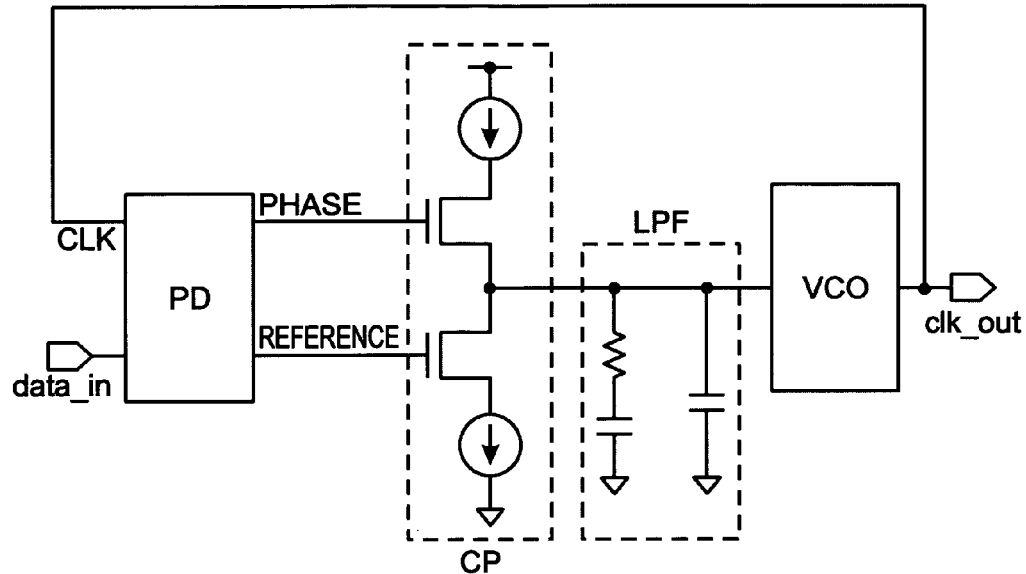
Fig. 2 *(PRIOR ART)*
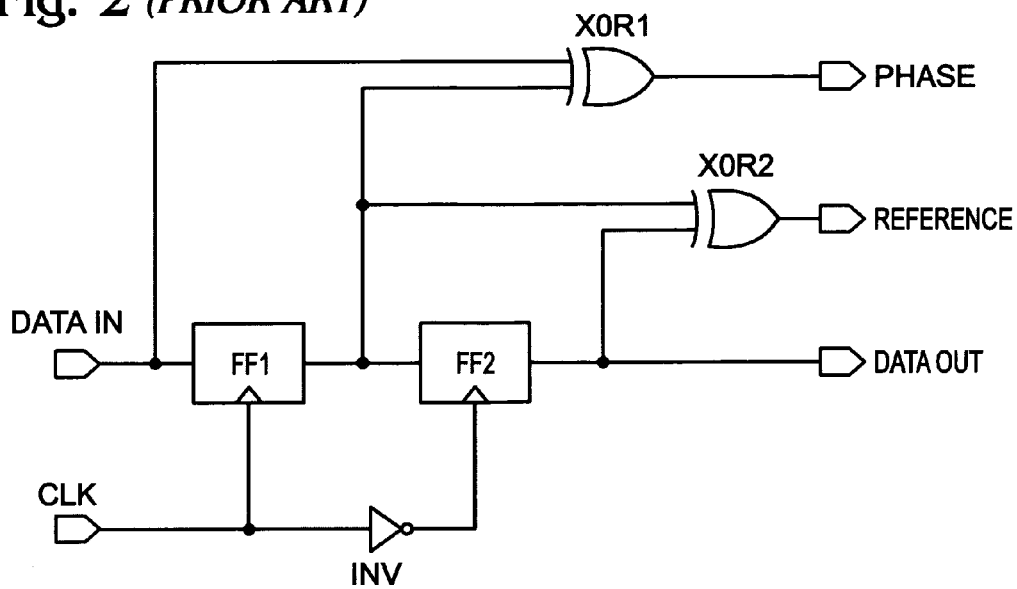

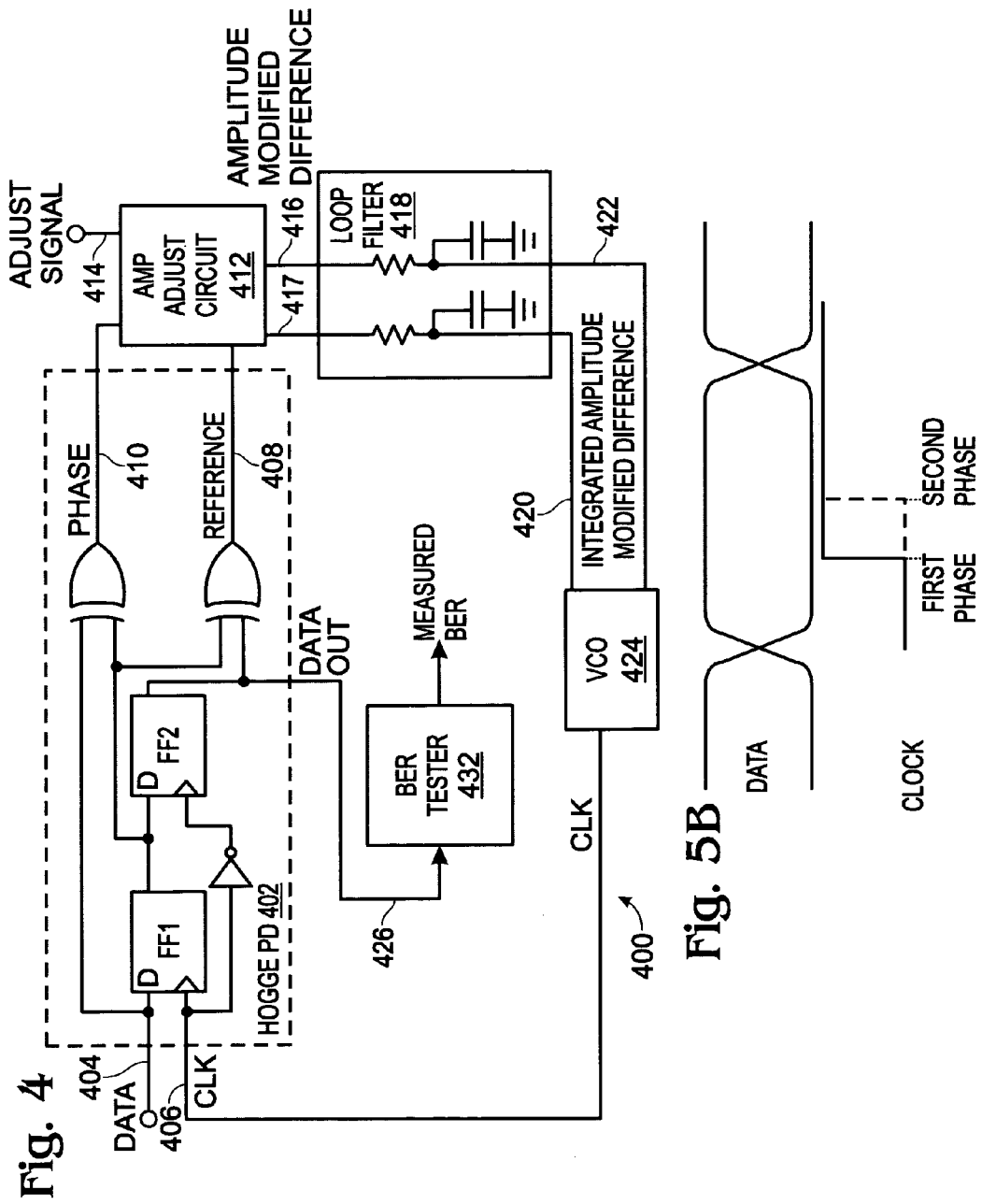

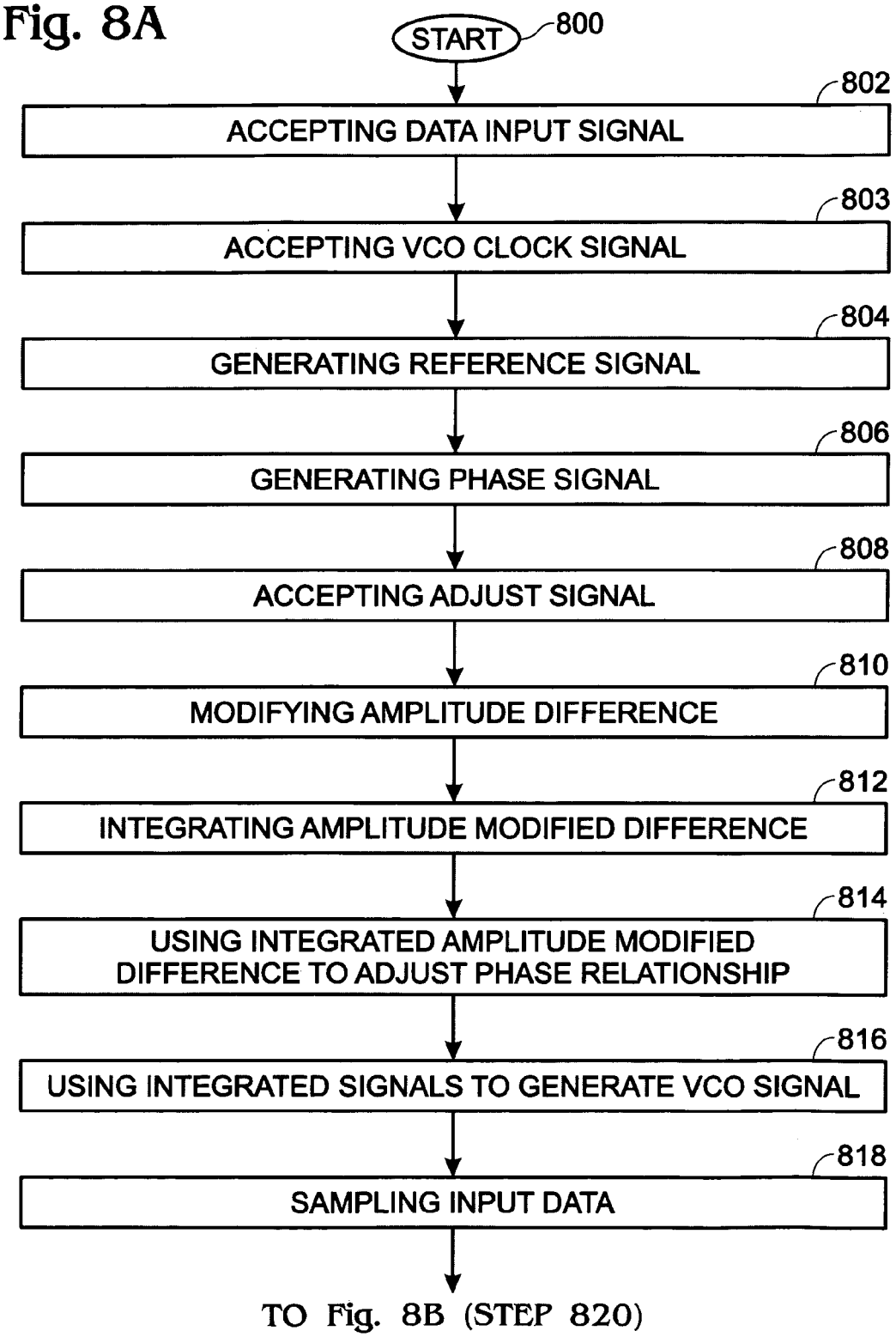

HOGGE PHASE DETECTOR WITH ADJUSTABLE PHASE OUTPUT

BACKGROUND OF THE INVENTION

1. Field of the Invention

This invention generally relates to serial communication systems dependent upon extracting a clock and, more particularly, to a system and method for modifying the phase of a clock used in a Hogge phase detector.

2. Description of the Related Art

As noted in U.S. Pat. No. 6,421,404 (Nakamura), in a serial communication system such as an optical communication system, it is necessary to extract a clock component (or signal) from a serial data sequence at the receiving side, so as to receive data based on the extracted clock signal. The circuit for extracting a clock signal from a serial data sequence is called a clock-recovery circuit. This clock-recovery circuit is an application of a phase-locked loop (PLL).

FIG. 1 depicts a conventional PLL (prior art). The reference symbol PD indicates a phase-difference detector, which detects a phase difference between a clock signal output from the VCO (voltage-controlled oscillator) and an input data-signal sequence, and determines whether the current phase is advanced or delayed and outputs the determined results as phase-difference signals. The phase-difference signals, a set of pulse signals whose pulse widths are proportional to each phase difference, are output from the "reference" terminal and the "phase" terminal at the output side. In this clock-recovery circuit, these reference and phase signals are fed back (as an input signal) via a charge-pump circuit and a low-pass filter into the VCO, so that the phase of the extracted clock signal corresponds to that of the data input signal.

FIG. 2 is a depiction of a conventional Hogge phase-difference detector (prior art).

FIG. 3 is a timing chart illustrating the operation of the circuit of FIG. 2 (prior art). Considering FIGS. 2 and 3, the Hogge PD comprises a flip-flop circuit FF1 into which a signal is input at (timing corresponding to) a rising edge of the clock signal, another flip-flop circuit FF2 which operates at (timing corresponding to) a decaying (or falling) edge of the clock signal, and two exclusive OR circuits XOR1 and XOR2. The exclusive OR (XOR1) between the data input signal and the output of FF1 is calculated so as to detect a phase difference between the clock signal and the data input signal, and a pulse signal whose pulse width corresponds to the detected phase difference is output from the phase (up) terminal. On the other hand, when a pulse signal is output from the phase terminal, a pulse signal whose pulse width corresponds to half of the clock period is output from the reference (down) terminal. Further, reference pulses are generated when data changes. That is, the output of FF2 is a different state than the input of FF2.

As shown in FIG. 3, in the time from 3.0 nanoseconds (ns) to 4.0 ns, the difference between the rise timing of the clock signal and the transition timing of the data input signal becomes half of the clock period. The pulse width of the signal from the phase terminal is half of the clock period. Therefore, the circuit of FIG. 2 can detect the phase difference. The PD of FIG. 1 is able to detect such phase differences, thereby realizing a clock-recovery circuit.

The circuit in FIG. 2 also has a data-recovery function for receiving and outputting data based on the extracted clock signal. That is, both (i) detection of the phase difference between the input data sequence and the extracted clock signal and (ii) data-receiving operation can be executed. However, a clock signal whose frequency can agree with the frequency of the data input signal (i.e., the data rate) is necessary. That is, as shown in the timing chart of FIG. 3, if the transition (between the high level and the low level) of the data input signal appears with a minimum period of 0.25 ns (see the section between 3 ns to 4 ns), then the period of the clock signal must also be 0.25 ns. Here, each "transition" of the data input signal corresponds to a period from a rise to a decay (or fall) of the data input signal, or to a period from a decay to a rise of it. The period of the high level or the low level of the clock signal is 0.125 ns, that is, half of the clock period. Therefore, the clock signal must maintain a frequency two times as high as the data rate.

In optical channels that may suffer from polarization mode dispersion (PMD) or other types of amplitude or phase distorting effects, the bit error rate (BER) of the system may be improved by adjusting the sampling point of the input data. That is, the BER can potentially be improved if the clock can be "decoupled" from the input data, and the data sampled with a different phase of the clock.

It would be advantageous if the clock phase used by a Hogge PD could be modified.

It would be advantageous if the modified Hogge phase detector clock could be used to sample data.

It would be advantageous if the modified Hogge phase detector clock could be used to sample data suffering from PMD, or other distorting effects, to improve the BER of received data.

SUMMARY OF THE INVENTION

The present invention describes a system and method for adjusting the phase of a clock signal, so as to vary the point at which a Hogge phase detector samples an input data stream. Conventionally, the center of a data pulse is sampled with a clock edge. This relationship between data and clock pulses optimally accommodates jitter and circuit propagation delays. However, there are circumstances where the BER of the received signal, or other measures of received data quality, can be improved by modifying the position of the clock edge with respect to the data pulse. The present invention provides a means of performing the modification of the clock edge position with respect to the data pulse. That is, the present invention adjusts the phase of a clock being generated from a Hogge PD.

Accordingly, a method is provided for adjusting the phase output of a Hogge phase detector. The method comprises: using a Hogge phase detector, generating phase and reference signals; accepting an adjust signal; modifying the amplitude of the phase signal in response to the adjust signal; integrating the amplitude modified phase signal and the reference signal; using the integrated reference signal and integrated amplitude modified phase signal to generate a voltage controlled oscillator (VCO) signal; at the Hogge phase detector, accepting the VCO signal as the clock signal. As explained in detail below, the adjust signal actually modifies the amplitude difference between phase and reference signals.

Some aspects of the method further comprise using the VCO signal to sample input data at a settled first phase of the VCO clock signal. Other aspects further comprise changing the adjust signal. Then, the amplitude modification of the phase signal is changed in response to the changed adjust signal. Using the integrated reference signal and integrated amplitude modified phase signal to generate a VCO signal includes generating a VCO clock signal with a settled second phase. Then, the data input can be sampled at a settled second phase of the VCO clock.

Additional details of the above-described method and a system for adjusting the phase signal of a Hogge phase detector are provided below.

BRIEF DESCRIPTION OF THE DRAWINGS

FIG. 1 depicts a conventional PLL (prior art).

FIG. 2 is a depiction of a conventional Hogge phase-difference detector (prior art).

FIG. 4 is a schematic block diagram of the present invention system for adjusting the phase signal of a Hogge phase detector.

FIGS. 5a and 5b are a VCO phase gain curve and timing diagram, respectively, illustrating the VCO operation.

FIGS. 8a and 8b are flowcharts illustrating the present invention method for adjusting the phase output of a Hogge phase detector.

DETAILED DESCRIPTION OF THE PREFERRED EMBODIMENTS

Figure 3:
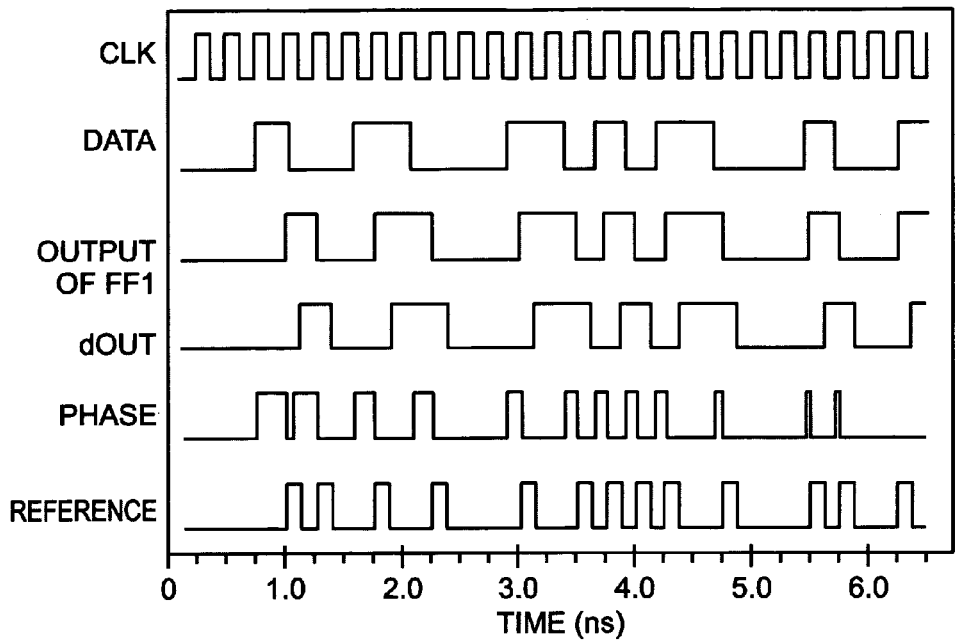
FIG. 3 is a timing chart illustrating the operation of the circuit of FIG. 2 (prior art).

FIG. 4 is a schematic block diagram of the present invention system for adjusting the phase signal of a Hogge phase detector. The system 400 comprises a Hogge phase detector 402 having an input on line 404 to accept a data input signal, an input on line 406 to accept a clock (clk) signal, an output on line 408 to supply a reference signal, and an output on line 410 to supply a phase signal. The Hogge PD 402 is a conventional PD as described in FIG. 2, above.

An amplitude adjust circuit 412 has an input on line 410 to accept the phase signal, an input on line 414 to accept an adjust signal, an input on line 408 to accept the reference signal, and outputs on lines 416 and 417 to supply an amplitude modified difference between the phase signal. In some aspects of the system 400, both the phase and reference signals are modified. The amplitude difference between the phase and reference signals results in a modified phase relationship between the phase and reference signals. In other aspects of the system 400, just the phase (or reference signal) is modified. The modification of just one signal still results in an amplitude modified difference between the phase and reference signals. Further, the amplitude modification of a single signal exemplifies the invention in a simpler manner.

A loop filter 418 has inputs on lines 416 and 417 to accept the amplitude modified difference between phase and reference signals. Outputs on lines 420 and 422 supply an integrated amplitude modified difference between phase and reference signals. Alternately stated, the loop filter 418 supplies integrated phase and reference signals with an adjusted phase relationship. Line 420 supplies an integrated reference signal and line 422 supplies an integrated phase signal. As noted above, either one or both of the loop filter input signals are amplitude modified. Again, it is the amplitude difference between the integrated phase and reference signals that is of interest. Note that although the loop filter 418 has been depicted as a simple resistor/capacitor (RC) network, the loop filter 418 can also be enabled using other and additional components (not shown), including active devices such as transistors and operational amplifiers, as is known in the art.

A voltage controlled oscillator (VCO) 424 has inputs on line 420 and 422 to accept the integrated amplitude modified difference between phase and reference signals. An output on line 406 supplies the clock signal. The clock signal generated by the VCO 424 is related to the amplitude of the integrated input signals. More specifically, the phase of the clock signal varies in response to differences between the integrated input signals. This phase gain relationship of a VCO is well understood in the art. Therefore, a change in the amplitude of the phase signal, or a change in the difference between the phase and reference signals results in a clock signal phase change.

In some aspects of the system 400, the amplitude adjust circuit 412 accepts a first adjust signal on line 414 and supplies a first amplitude modified difference between phase and reference signals on lines 416 and 417. Then, the VCO 424 supplies a clock signal on line 406 with a settled first phase in response to a first integrated amplitude modified difference between phase and reference signals on lines 420 and 422. The Hogge phase detector 402 has a data output on line 426 to supply data sampled at the clock signal settled first phase. It should be understood that changes in the VCO clock phase are non-instantaneous, as the rate of change is primarily affected by the relatively slow loop filter bandwidth. Likewise, the VCO clock phase is also affected by noise on the input data line, component tolerances, and power supply fluctuations. Therefore, the settled first phase clock signal is the signal that results after the loop has settled. The settled phase clock signal is also averaged to account for the affect of jitter and other minor phase perturbations.

The data rate may be as high as gigabits per second. The loop filter 412 averages the reference and amplitude modified phase signals, producing dc voltages that "push" the VCO 424 to the correct frequency, and a phase that defines the relationship between the clock pulse and the incoming data pulses. The movement of the VCO's phase is relatively slow compared to the data rate, and is called the loop bandwidth.

In other aspects, the amplitude adjust circuit 412 accepts a second adjust signal on line 414 and supplies a second amplitude modified difference between phase and reference signals on lines 416 and 417. Then, the VCO 424 supplies a clock signal on line 406 with a settled second phase in response to a second integrated amplitude modified difference between phase and reference signals on lines 420 and 422. The Hogge phase detector 402 supplies data out on line 426 that is sampled at the clock signal settled second phase.

Figure 5A:
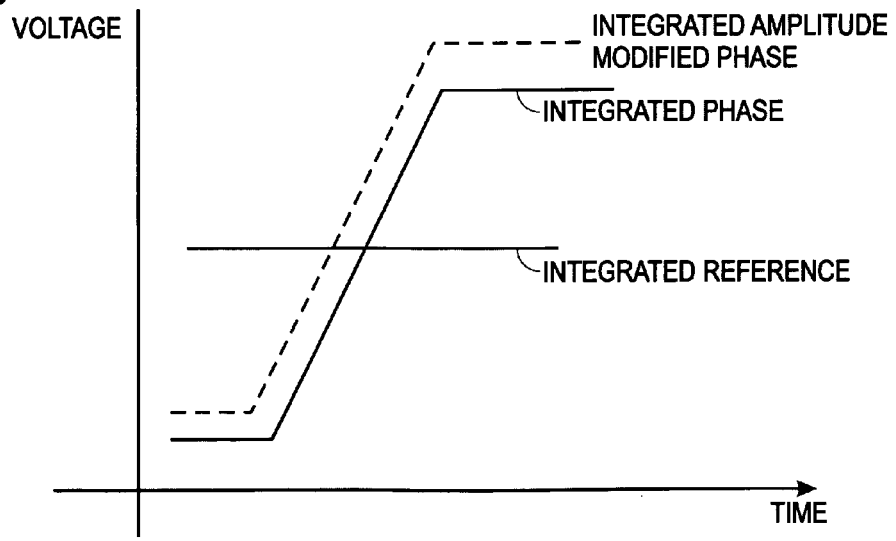

FIGS. 5a and 5b are a VCO phase gain curve and timing diagram, respectively, illustrating the VCO operation. FIG. 5a illustrates the relationship between integrated phase and reference signals. The solid lines represent the relationship between phase and reference signals that result in the VCO clock settled first phase. The dotted phase line is a result of amplitude modifying the phase signal. The difference between the amplitude modified phase signal and the reference signal result in the VCO clock settled second phase.

FIG. 5b is a timing diagram illustrating the above-mentioned clock signal settled first phase with respect to the clock signal settled second phase. Note that the phases are only exemplary. The present invention system is not limited to any particular clock phases or relationship between clock phases.

Returning to FIG. 4, in some aspects of the system 400 the output data sampled on line 426 is connected to the input of a bit error rate (BER) tester 432. The BER tester 432 supplies a measured first bit error rate (BER) responsive to the first adjust signal (the clock signal settled first phase). Likewise, the data output on line 426 can be sampled at the clock signal settled second phase. Then, the BER tester 432 supplies a measured second BER, lower than the first BER, in response to the second adjust signal. The BER can be determined, for example, using a (predetermined) test data pattern or by performing a forward error correction (FEC) where the data input includes redundant data. Other means of determining BER are known to those skilled in the art. Further, BER is being mentioned as a means of determining receiver quality. Other means, besides BER, can also be used to determine or compare the quality of received input signals FIG. 4 depicts the system 400 using single-ended signals that are referenced with respect to a dc voltage, such as ground. Alternately but not shown, the system 400 may be enabled using differential data, clock, reference, phase, amplitude modified phase, integrated reference, and integrated amplitude modified phase signals. In one aspect of the invention, the input data, phase, reference, and clock signals are differential, and the amplitude modified signals (the VCO input) are single-ended signals.

Figure 6:
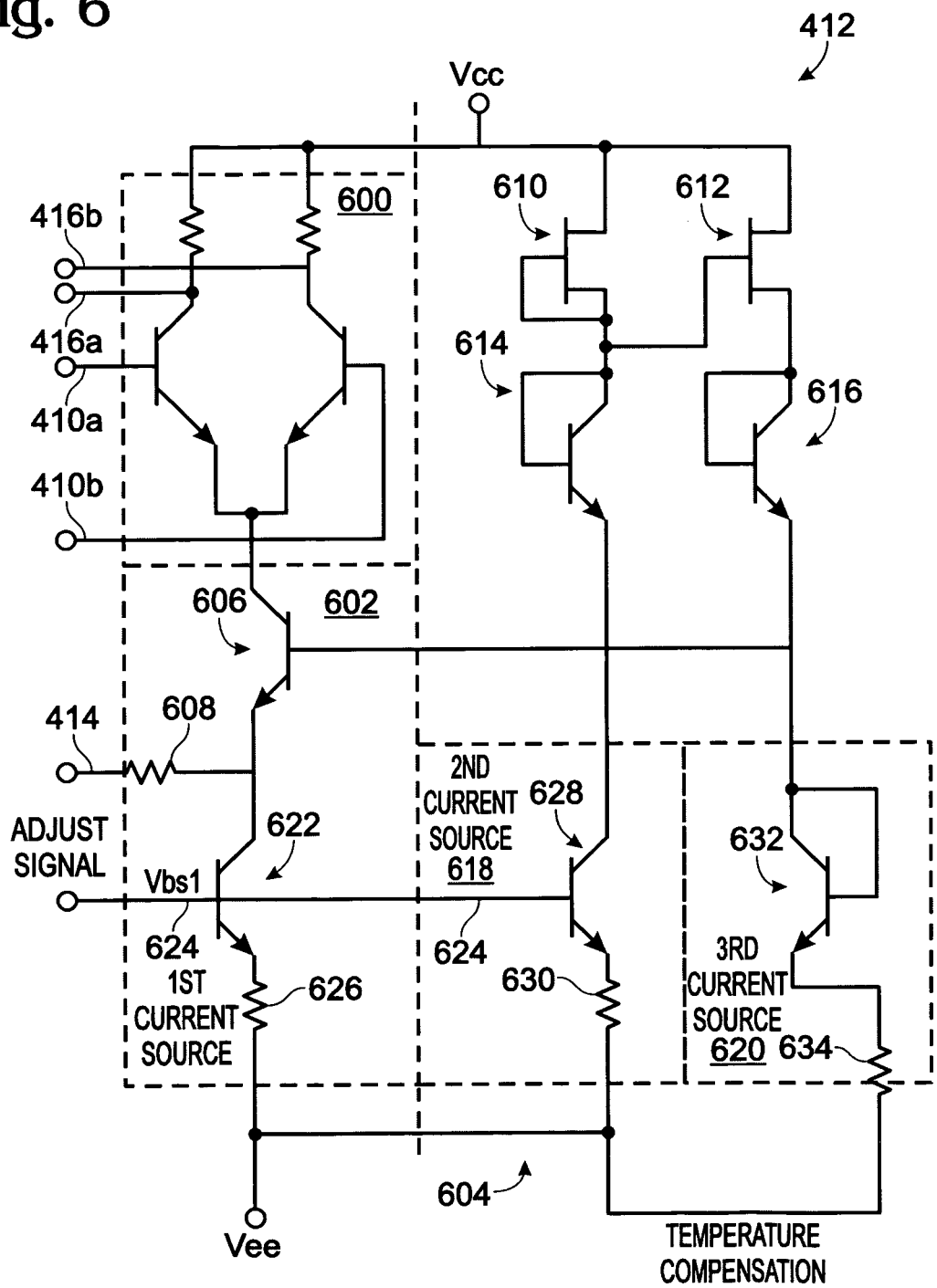
FIG. 6 is a schematic diagram illustrating the amplitude adjust circuit of FIG. 4 in greater detail.

FIG. 6 is a schematic diagram illustrating the amplitude adjust circuit 412 of FIG. 4 in greater detail. The figure depicts the use of differential signals, however, the invention can also be enabled using single-ended signals. The Hogge phase detector supplies differential reference signals on line 408a and 408b and differential phase signals on lines 410a and 410b. The amplitude adjust circuit 412 includes a first emitter-coupled differential amplifier 600 having inputs to accept the differential phase signal 410a/410b and outputs to supply a differential amplitude modified phase signal 416a/416b. In some aspects, only a single-ended amplitude modified phase signal is supplied (either 416a or 416b). A first current source 602 is connected to the emitters of the first differential amplifier 600 having an input on line 414 to accept the adjust signal. A temperature compensation circuit 604 (to the right side of the vertical dotted line) is connected to supply temperature compensation current to the first current source 602. More specifically, it is assumed that the adjust signal remains constant over temperature. The temperature compensation circuit cancels current variations in the first bipolar transistor 606 that occur as a result of temperature changes.

The first current source 602 includes the first bipolar transistor 606 having a collector connected to the emitters of the first differential amplifier 600 and a first resistor 608 interposed between the emitter of the first bipolar transistor 606 and the adjust signal on line 414.

The temperature compensation circuit 604 includes a first field effect transistor (FET) 610 having a drain connected to a first power supply (Vcc) and a gate connected to the source. A second FET 612 has a drain connected to the first power supply and a gate connected to the source of the first FET 610. A second bipolar transistor 614 has a base and collector connected to the source of the first FET 610. A third bipolar transistor 616 has a base and collector connected to the source of the second FET 612, and an emitter connected to the base of the first bipolar transistor 606. A second current source 618 is connected to the emitter of the second bipolar transistor 614 and a third current source 620 connected to the emitter of the third bipolar transistor 616.

In some aspects, the first current source 602 further includes a fourth bipolar transistor 622 having a collector connected to the emitter of the first bipolar transistor 606 and a base to receive a first bias voltage (Vbs1) on line 624. Note that is some aspects, the first bias voltage is compensated to account for current fluctuations in the above-mentioned transistors and fluctuations in power supply voltages. A second resistor 626 is interposed between the emitter of the fourth bipolar transistor 622 and a second power supply (Vee), lower in potential than the first power supply.

In some aspects, the second current source 618 includes a fifth bipolar transistor 628 having a collector connected to the emitter of the second bipolar transistor 614 and a base to accept the first bias voltage on line 624. A third resistor 630 is interposed between the emitter of the fifth bipolar transistor 628 and the second power supply.

In some aspects, the third current source 620 includes a sixth bipolar transistor 632 having a collector and base connected to the emitter of the third bipolar transistor 616. A fourth resistor 634 is interposed between the emitter of the sixth bipolar transistor 632 and the second power supply.

Figure 7:
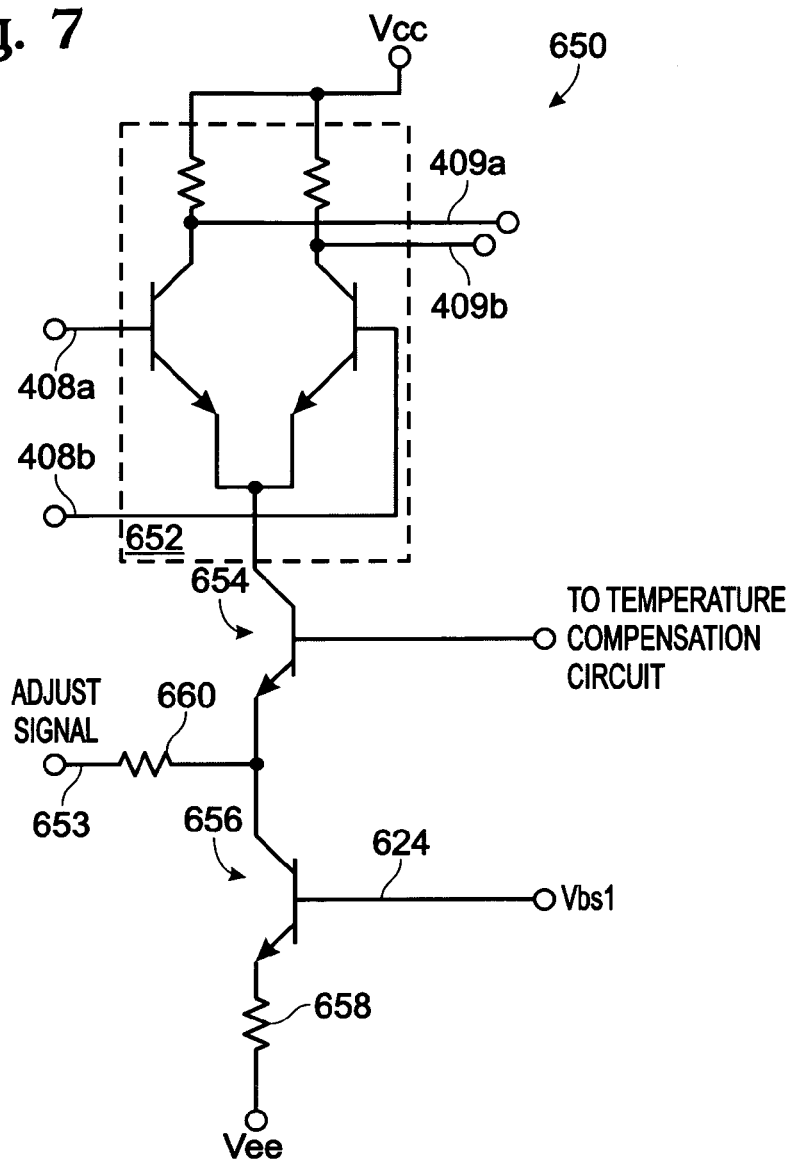
FIG. 7 is a schematic diagram illustrating additional details of the amplitude adjust circuit of FIG. 4.

FIG. 7 is a schematic diagram illustrating additional details of the amplitude adjust circuit 412 of FIG. 4. In some aspects, the amplitude adjust circuit 412 amplitude modifies the reference signal. As noted above, the amplitude modified difference between phase and reference signals can be obtained by modifying just the phase signal, just the reference signal, or both the phase and reference signals. In this aspect, the adjust signal is supplied on line 653. Then, a reference signal modifier circuit 650 includes a second emitter-coupled differential amplifier 652 having inputs on lines 408a and 408b to accept the differential reference signal and outputs to supply an amplitude modified reference signal on lines 417a and 417b. Note in some aspects, a single-ended amplitude modified signal is supplied (on line 417a or 417b) in response to a differential reference signal on lines 408a and 408b.

A seventh bipolar transistor 654 has a collector connected to the emitters of the second differential amplifier 652 and a base connected to a temperature compensation circuit (not shown). A sixth resistor 660 is interposed between the adjust signal and the emitter of the seventh bipolar transistor 654. The temperature compensation circuit would be equivalent to the temperature compensation 604 of FIG. 6. The temperature compensation circuit would account for fluctuations in the performance of transistor 654, assuming the adjust signal remains constant over temperature. An eighth bipolar transistor 656 has a collector connected to the emitter of the seventh bipolar transistor 654 and a base to accept the first bias voltage on line 624. A fifth resistor 658 is interposed between the emitter of the eighth bipolar transistor 656 and the second power supply.

The first, second, third, fourth, fifth, sixth, seventh, and eighth bipolar transistors described in FIGS. 6 and 7 are typically n-p-n transistors. However, in other aspects of the invention, some or all of these transistors could be replaced with p-n-p, or even FET transistors.

Figure 8B:
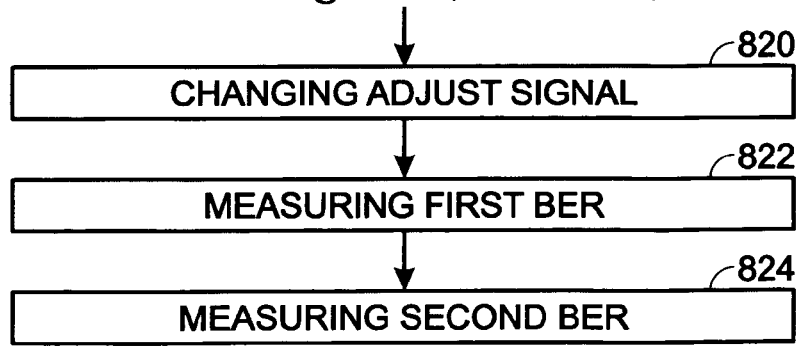

FIGS. 8a and 8b are flowcharts illustrating the present invention method for adjusting the phase output of a Hogge phase detector. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800.

Step 802, at a Hogge phase detector, accepts a data input signal. Step 804, using the Hogge phase detector, generates a reference signal in response to the data input signal.

Likewise, Step 806, using the Hogge phase detector, generates a phase signal in response to the data input signal. Step 808 accepts an adjust signal. Step 810 modifies the amplitude of the difference between phase and reference signals, in response to the adjust signal. Step 812 integrates the amplitude modified difference between phase and reference signals. Step 814 uses the integrated signals to adjust the phase relationship between the phase and reference signals. Step 816 uses the phase relationship adjusted phase and reference signals (the integrated signals) to generate a voltage controlled oscillator (VCO) signal.

Some aspects of the method include a further step. Step 803, at the Hogge phase detector, accepts the VCO signal as the clock signal. Then, generating a reference signal in Step 804 includes generating a reference signal in response to the VCO clock signal. Likewise, generating a phase signal in Step 806 includes generating a phase signal in response to the VCO clock signal.

Other aspects of the method include an additional step. Step 818 samples the input data signal at a settled first phase of the VCO clock signal. The phase is (arbitrarily) defined with respect to the data input signal, which is assumed to have a constant data rate and phase. Alternately, the relative position of the data pulses can be defined with respect to the clock pulses. Step 820 changes the adjust signal. Then, modifying the amplitude difference between the phase and reference signals in Step 810 includes modifying the amplitude difference in response to changing the adjust signal. Using the phase relationship adjusted phase and reference signals (the integrated signals) to generate a VCO signal in Step 816 includes generating a VCO clock signal with a settled second phase (different than the first phase with respect to the input data signal). Then, sampling the data input signal in Step 818 includes sampling the input data signal at the settled second phase of the VCO clock signal.

In some aspects, Step 822 measures a first bit error rate (BER) in response to using the VCO clock signal to sample the data input signal at the first phase. Step 824 measures a second BER, lower than the first BER, in response to using the phase changed VCO signal to sample the data input signal at the second phase.

A system and method have been provided for adjusting the phase output of a Hogge phase detector. The invention has been explained with specific examples and circuit details. However, the invention is not necessarily limited to just these examples. Other variations and embodiments of the invention will occur to those skilled in the art.

We claim:

1. A system for adjusting the phase signal of a Hogge phase detector, the system comprising:
    a Hogge phase detector having an input to accept a data input signal, an input to accept a clock signal, an output to supply differential reference signals, and an output to supply differential phase signals; and,
    an amplitude adjust circuit including:
    a first emitter-coupled differential amplifier having inputs to accept the differential phase signal and outputs to supply amplitude modified phase signal;
    a first current source connected to the emitters of the first differential amplifier having an input to accept the adjust signal; and,
    a temperature compensation circuit connected to supply temperature compensation current to the first current source;
    wherein the first current source includes:
        a first bipolar transistor having a collector connected to the emitters of the first differential amplifier; and,
        a first resistor interposed between the emitter of the first bipolar transistor and the adjust signal;
    wherein the temperature compensation circuit includes:
        a first field effect transistor (FET) having a drain connected to a first power supply (Vcc), and a gate connected to the source;
        a second FET having a drain connected to the first power supply and a gate connected to the source of the first FET;
        a second bipolar transistor having a base and collector connected to the source of the first FET;
        a third bipolar transistor having a base and collector connected to the source of the second FET, and an emitter connected to the base of the first bipolar transistor;
        a second current source connected to the emitter of the second bipolar transistor; and,
        a third current source connected to the emitter of the third bipolar transistor.

2. The system of claim 1 further comprising:
    a loop filter having an input to accept the amplitude modified difference between the phase and reference signals and an output to supply integrated phase and reference signals with an adjusted phase relationship; and,
    a voltage controlled oscillator (VCO) having an input to accept the integrated phase and reference signals with the adjusted phase relationship and an output to supply the clock signal.

3. The system of claim 2 wherein the amplitude adjust circuit accepts a first adjust signal and supplies a first amplitude modified difference between phase and reference signals;
    wherein the VCO supplies a clock signal with a settled first phase in response to a first integrated amplitude modified difference between phase and reference signals; and,
    wherein the Hogge phase detector supplies a data out signal sampled at the settled first phase of the clock signal.

4. The system of claim 3 wherein the amplitude adjust circuit accepts a second adjust signal and supplies a second amplitude modified difference between phase and reference signal;
    wherein the VCO supplies a clock signal with a settled second phase in response to a second integrated amplitude modified difference between phase and reference signals; and,
    wherein the Hogge phase detector supplies a data out signal sampled at a settled second phase of the clock signal.

5. The system of claim 4 further comprising:
    a bit error rate (BER) tester having an input connected to receive the data out signal from the Hogge phase detector and an output to supply a first measured BER responsive to the first adjust signal, and a second measured BER, lower than the first BER, in response to the second adjust signal.

6. The system of claim 1 wherein the first current source further includes:
    a fourth bipolar transistor having a collector connected to the emitter of the first bipolar transistor and a base to receive a first bias voltage (Vbs1); and,
    a second resistor interposed between the emitter of the fourth bipolar transistor and a second power supply (Vee), lower in potential than the first power supply.

7. The system of claim 6 wherein the second current source includes:
   a fifth bipolar transistor having a collector connected to the emitter of the second bipolar transistor and a base to accept the first bias voltage; and,
   a third resistor interposed between the emitter of the fifth bipolar transistor and the second power supply.

8. The system of claim 7 wherein the third current source includes:
   a sixth bipolar transistor having a collector and base connected to the emitter of the third bipolar transistor; and,
   a fourth resistor interposed between the emitter of the sixth bipolar transistor and the second power supply.

9. The system of claim 8 wherein the first, second, third, fourth, fifth, and sixth bipolar transistors are n-p-n transistors.

10. The system of claim 1 further comprising:
   a reference signal modifier circuit including:
   a second emitter-coupled differential amplifier having inputs to accept the differential reference signal and outputs to supply an amplitude modified reference signal;
   a seventh bipolar transistor having a collector connected to the emitters of the second differential amplifier and a base connected to base of the first bipolar transistor;
   a sixth resistor interposed between the emitter of the seventh bipolar transistor and the adjust signal;
   an eighth bipolar transistor having a collector connected to the emitter of the seventh bipolar transistor and a base to accept the first bias voltage; and,
   a fifth resistor interposed between the emitter of the eighth bipolar transistor and the second power supply.

11. The system of claim 10 wherein the reference signal modifier circuit further includes a temp compensation circuit connected to the base of the seventh bipolar transistor.

12. A system for adjusting the phase signal of a Hogge phase detector, the system comprising:
   a Hogge phase detector having an input to accept a data input signal, an input to accept a clock signal, an output to supply a reference signal, and an output to supply a phase signal;
   an amplitude adjust circuit having an input to accept the Hogge phase detector output signals, an input to accept an adjust signal, and an output to supply an amplitude modified difference between the phase and reference signals; and,
   a reference signal modifier circuit including
      a second emitter-coupled differential amplifier having inputs to accept the differential reference signal and outputs to supply an amplitude modified reference signal;
      a seventh bipolar transistor having a collector connected to the emitters of the second differential amplifier and a base connected to base of the first bipolar transistor;
      a sixth resistor interposed between the emitter of the seventh bipolar transistor and the adjust signal;
      an eighth bipolar transistor having a collector connected to the emitter of the seventh bipolar transistor and a base to accept the first bias voltage; and,
      a fifth resistor interposed between the emitter of the eighth bipolar transistor and the second power supply.

13. The system of claim 12 wherein the reference signal modifier circuit further includes a temp compensation circuit connected to the base of the seventh bipolar transistor.

* * * * *